US012598866B2

(12) United States Patent
Liu

(10) Patent No.: US 12,598,866 B2
(45) Date of Patent: Apr. 7, 2026

(54) DISPLAY PANEL AND DISPLAY DEVICE HAVING TWO ACTIVE LAYERS OF TWO TRANSISTORS OF DIFFERENT MATERIAL

(71) Applicant: SHENZHEN CHINA STAR OPTOELECTRONICS SEMICONDUCTOR DISPLAY TECHNOLOGY CO., LTD., Guangdong (CN)

(72) Inventor: Yunxi Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 518 days.

(21) Appl. No.: 18/149,047

(22) Filed: Dec. 30, 2022

(65) Prior Publication Data
US 2024/0215312 A1 Jun. 27, 2024

(30) Foreign Application Priority Data

Dec. 22, 2022 (CN) ......................... 202211659307.3

(51) Int. Cl.
*H01L 29/08* (2006.01)
*H10K 59/121* (2023.01)
(Continued)

(52) U.S. Cl.
CPC ..... *H10K 59/1213* (2023.02); *H10K 59/1216* (2023.02); *H10K 59/124* (2023.02);
(Continued)

(58) Field of Classification Search
CPC ........... H10K 59/1201; H10K 59/1213; H10K 59/124; H10K 59/1216; H10K 71/00;
(Continued)

(56) References Cited

U.S. PATENT DOCUMENTS

| | | | |
|---|---|---|---|
| 2013/0288426 A1 | 10/2013 | Akimoto | |
| 2014/0091366 A1* | 4/2014 | Jeon | H10D 88/101 |
| | | | 257/195 |
| 2020/0111433 A1 | 4/2020 | Kikuchi | |

FOREIGN PATENT DOCUMENTS

| | | |
|---|---|---|
| CN | 113168788 A | 7/2021 |
| CN | 113871403 A | 12/2021 |

(Continued)

OTHER PUBLICATIONS

Cite the machine translation Kikuchi T (WO-2018180617).*
(Continued)

*Primary Examiner* — Phuc T Dang
(74) *Attorney, Agent, or Firm* — PV IP PC; Peter Stecher; Wei Te Chung

(57) ABSTRACT

A display panel and a display device are provided. The display panel includes a first transistor, a second transistor, and a first interlayer insulating layer between the first transistor and the second transistor. The first transistor includes a first active layer, and a material of the first active layer is an amorphous oxide semiconductor. The second transistor includes a second active layer, and a material of the second active layer is a polycrystalline oxide semicon-ductor.

17 Claims, 8 Drawing Sheets

(51) Int. Cl.

| | |
|---|---|
| H10K 59/124 | (2023.01) |
| H10K 71/00 | (2023.01) |
| *H10D 30/67* | (2025.01) |
| *H10D 86/40* | (2025.01) |
| *H10D 86/60* | (2025.01) |
| *H10K 59/12* | (2023.01) |

(52) U.S. Cl.
CPC ......... H10K 71/00 (2023.02); *H10D 30/6755* (2025.01); *H10D 30/6756* (2025.01); *H10D 86/423* (2025.01); *H10D 86/425* (2025.01); *H10D 86/481* (2025.01); *H10D 86/60* (2025.01); *H10K 59/1201* (2023.02)

(58) Field of Classification Search
CPC ........... H10D 30/6756; H10D 30/6755; H10D 86/60; H10D 86/425; H10D 86/423
USPC ........................................................ 257/40
See application file for complete search history.

(56) References Cited

FOREIGN PATENT DOCUMENTS

| | | | | |
|---|---|---|---|---|
| JP | 2006237447 A | 9/2006 | | |
| WO | WO-2018180617 A1 * | 10/2018 | ......... | G02F 1/13454 |
| WO | WO-2020105418 A1 * | 5/2020 | ......... | G06V 40/1318 |

OTHER PUBLICATIONS

Cite the machine translation Uchida M (WO-2020105418-A).*
Chinese Office Action issued in corresponding Chinese Patent Application No. 202211659307.3 dated Nov. 22, 2025, pp. 1-8.

* cited by examiner

30
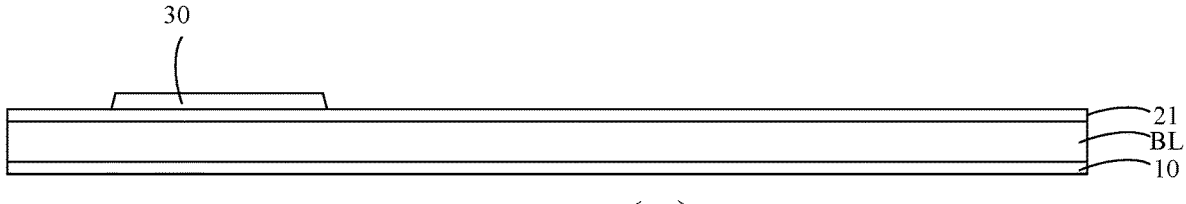
21
BL
10
FIG. 3 （a）
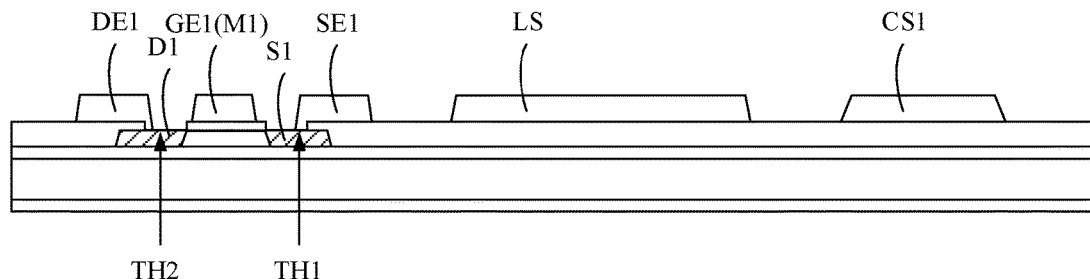
FIG. 3 （b）
FIG. 3 （c）

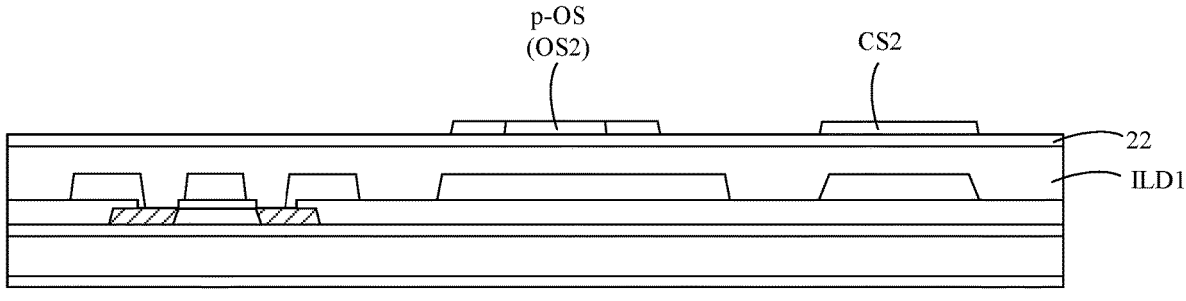
FIG. 3 （d）
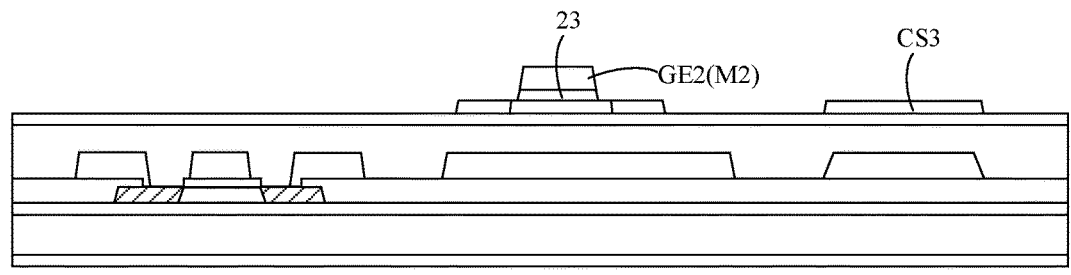
FIG. 3 （e）

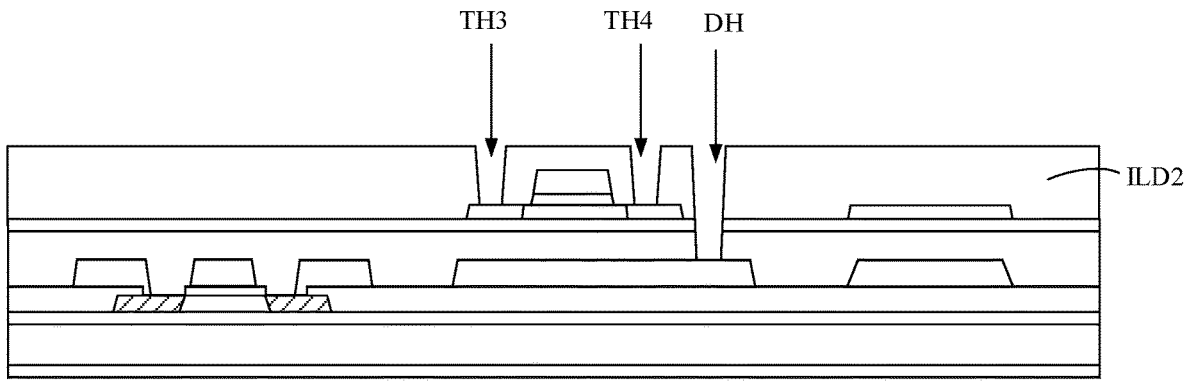
FIG. 3（f）
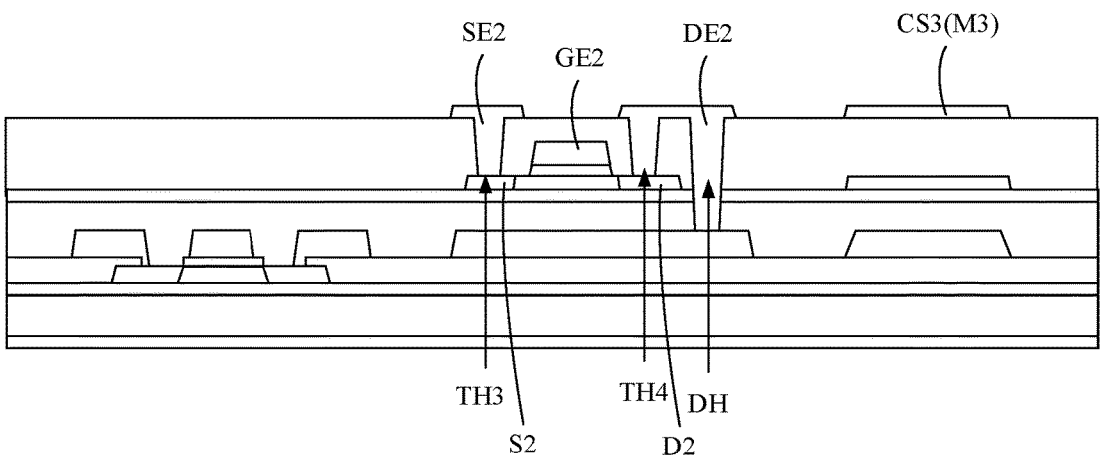
FIG. 3（g）

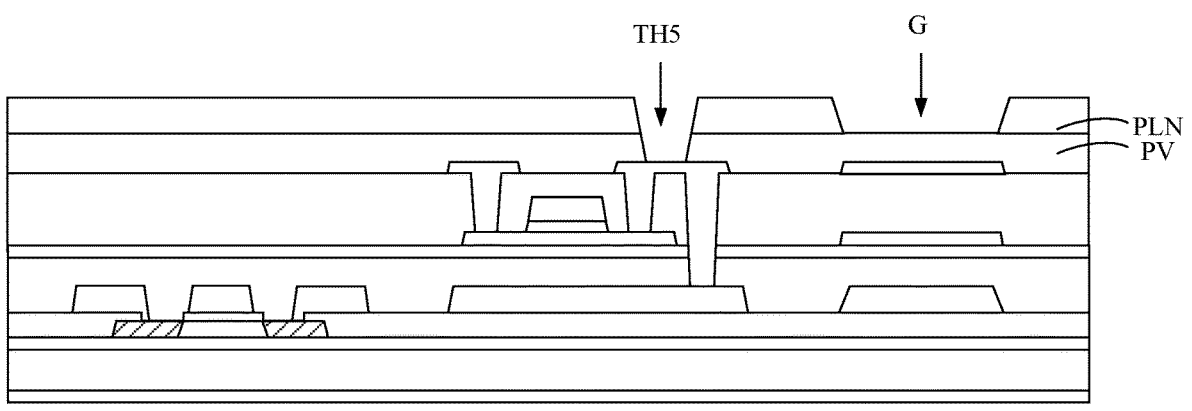
FIG. 3 （h）
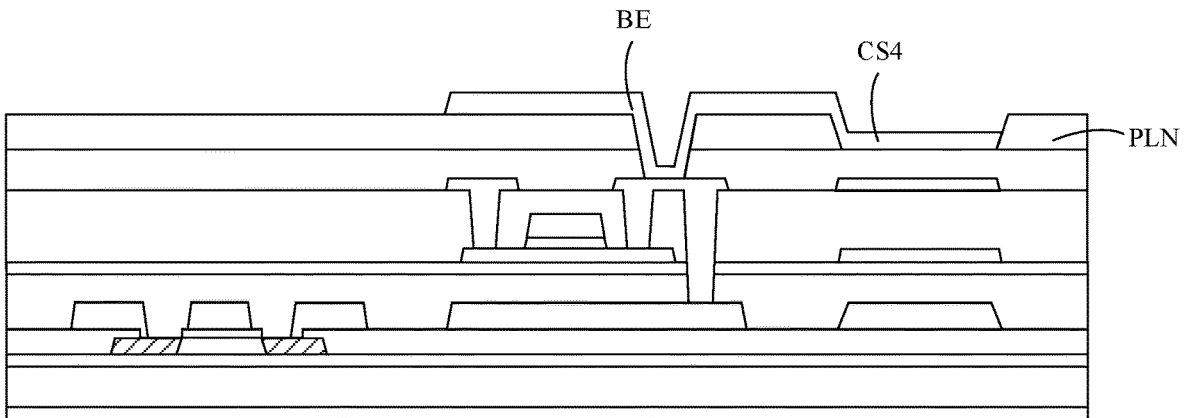
FIG. 3 （i）

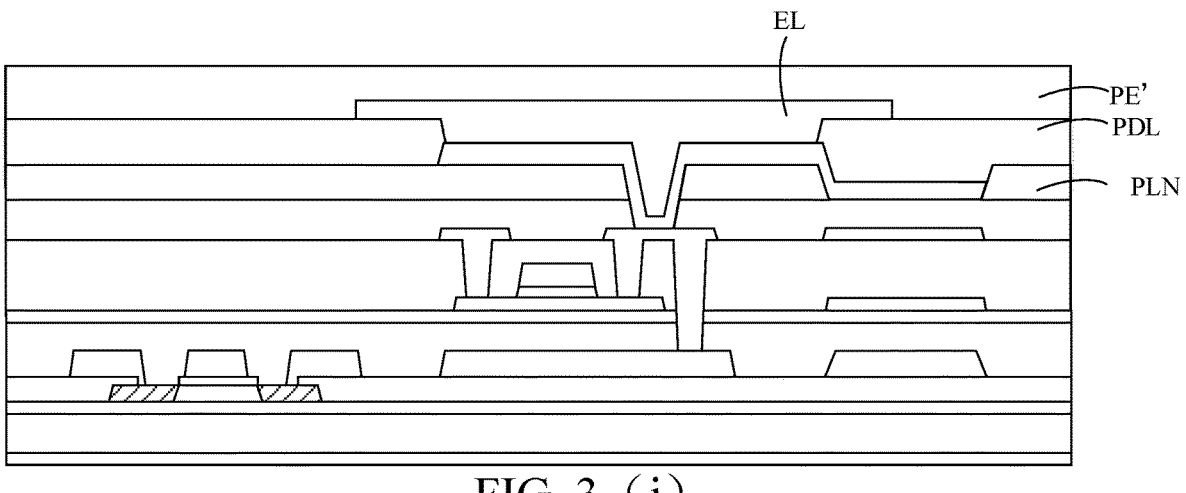
FIG. 3 （j）

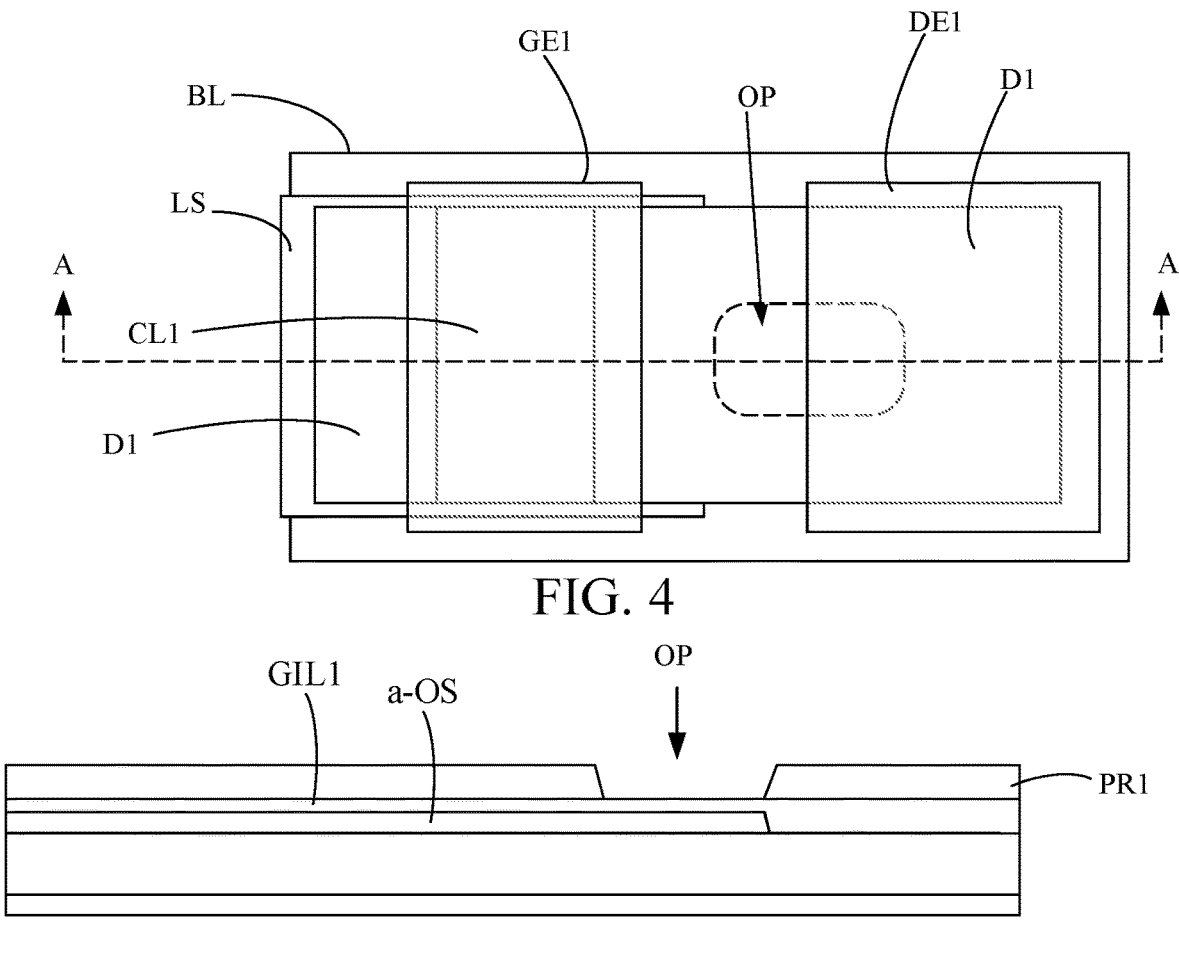
FIG. 4
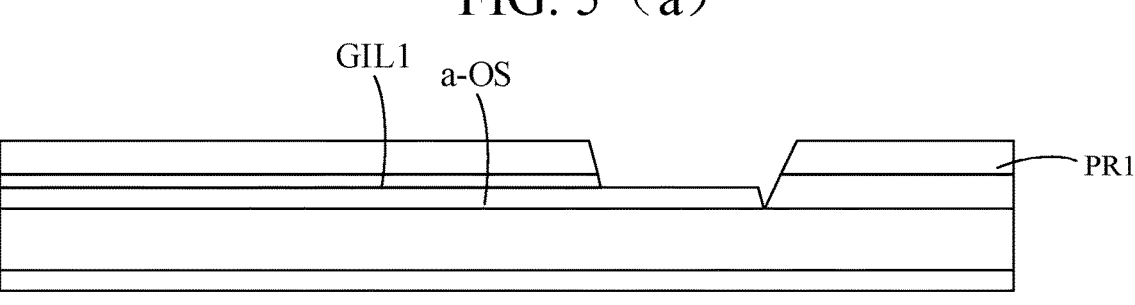
FIG. 5 （a）
FIG. 5 （b）

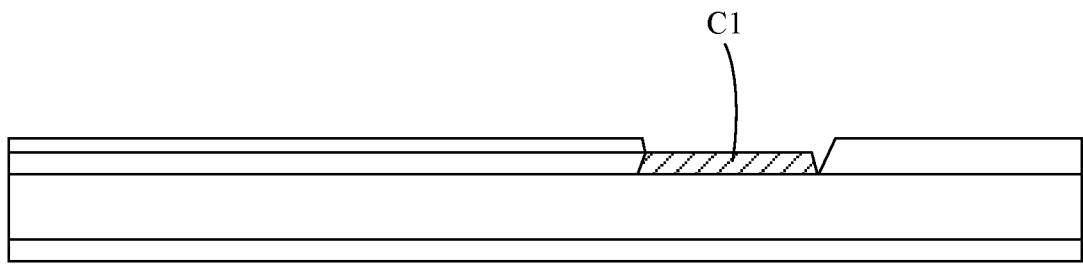
FIG. 5（c）
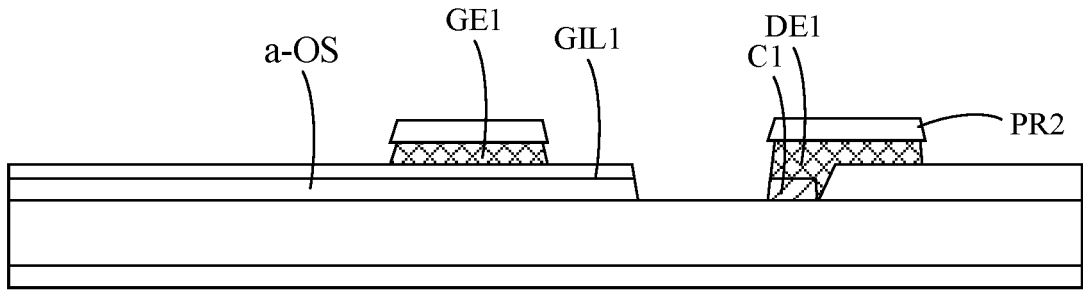
FIG. 5（d）
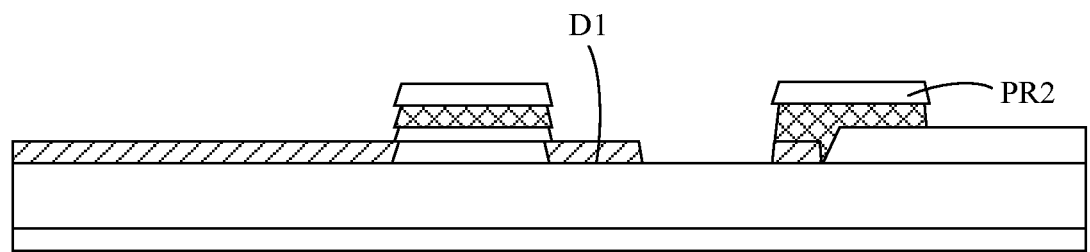
FIG. 5（e）
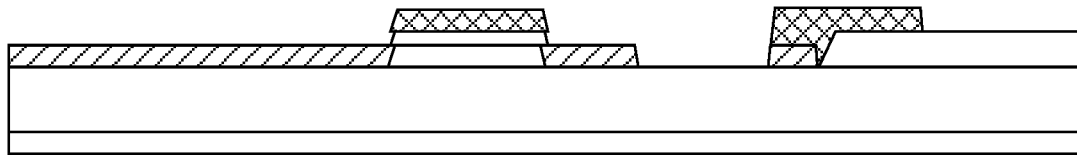
FIG. 5（f）

DISPLAY PANEL AND DISPLAY DEVICE HAVING TWO ACTIVE LAYERS OF TWO TRANSISTORS OF DIFFERENT MATERIAL

TECHNICAL FIELD

The present disclosure relates to the display field, in particular to a display panel and a display device.

BACKGROUND

Low temperature poly-Si and oxide (LTPO) backplane technology is currently widely used in small-sized wearable devices, combining low cut-off current of oxide semiconductor material and high carrier mobility characteristic of low temperature polysilicon (LTPS), the LTPO backplane technology can realize variable refresh rate and Always-on display. However, in large-scale display products, there is a problem in uniformity when using Excimer laser annealing (ELA) to fabricate the LTPS. The nonuniformity in characteristics of thin film transistors (TFTs) caused by the non-uniformity of the LTPS will induce decline in display quality, and the high cost of the LTPO backplane is not conducive to mass production of the large-scale display products. In addition, driving TFTs of polysilicon semiconductor materials still have the problem of high cut-off current.

SUMMARY

In view of this, the present disclosure provides a display panel and a display device capable of improving the uniformity in characteristics of thin film transistors and reducing cut-off current.

The present disclosure provides a display panel, which includes a substrate, a first transistor, a first interlayer insulating layer, a second transistor, and a second active layer. The first transistor is disposed on the substrate, the first transistor includes a first active layer, and a material of the first active layer is an amorphous oxide semiconductor. The first interlayer insulating layer covers a side of the first transistor away from the substrate. The second transistor is disposed on a side of the first interlayer insulating layer away from the first transistor, the second transistor includes a second active layer, and a material of the second active layer is a polycrystalline oxide semiconductor.

Optionally, in some embodiments, the first transistor further includes a first gate insulating layer covering the first active layer, a first gate electrode, a first source electrode, and a first drain electrode of the first transistor are located on a side of the interlayer insulating layer away from the second transistor, and located on a side of the first gate insulating layer away from the substrate.

Optionally, in some embodiments, the second transistor includes a second gate insulating layer and a second interlayer insulating layer sequentially covering the second active layer, a second source electrode and a second drain electrode of the second transistor are disposed on a side of the interlayer insulating layer away from the first transistor and located on a side of the second interlayer insulating layer away from the substrate, and a second gate electrode is located on a side of the second active layer close to the second source electrode.

Optionally, in some embodiments, the display panel further includes a a storage capacitor, the storage capacitor indisposed on a peripheral side of the second transistor, and the storage capacitor includes a first capacitor plate and a second capacitor plates, the first capacitor plate and the second capacitor plate form a first capacitor, the second capacitor plate and the second active layer are arranged on a same layer, a material of the second capacitor plate is a conducted polycrystalline oxide semiconductor, and the first capacitor plate and the first gate electrode are arranged in a same layer.

Optionally, in some embodiments, the storage capacitor further includes a third capacitor plate, and the third capacitor plate and the first capacitor plate are respectively located on opposite sides of the second capacitor plate, the third capacitor plate and the second capacitor plate form a second capacitor, the second capacitor is connected in parallel with the first capacitor, and the third capacitor plate and the second drain electrode are arranged in a same layer.

Optionally, in some embodiments, the storage capacitor further includes a fourth capacitor plate, the fourth capacitor plate is arranged on a side of the third capacitor plate far away from the second capacitor plate, the fourth capacitor plate and the third capacitor plate form a third capacitor, the third capacitor connected in parallel with the first capacitor and the second capacitor, and the fourth capacitor plate and an anode of the display panel are arranged in a same layer.

Optionally, in some embodiments, the display panel further includes a storage capacitor, the storage capacitor is disposed on a peripheral side of the second transistor, the storage capacitor includes a first capacitor plate and a second capacitor plate, the first capacitor plate and the second capacitor plate form a first capacitor, the second capacitor plate is arranged on a same layer as the second active layer, a material of the second capacitor plate is a conducted polycrystalline oxide semiconductor, and the first capacitor plate and the second drain electrode are arranged in a same layer.

Optionally, in some embodiments, the display panel further includes a planarization layer located between the second transistor and the anode, wherein the planarization layer is defined with a slot, and the fourth capacitor plate is located in the slot.

Optionally, in some implementation manners, the display panel further includes a first barrier layer, and the first barrier layer is disposed between the first interlayer insulating layer and the second transistor.

Optionally, in some embodiments, the display panel further includes a buffer layer and a second barrier layer, wherein the buffer layer is located between the substrate and the first active layer, and the second barrier layer is disposed between the buffer layer and the first active layer.

Optionally, in some embodiments, the second transistor includes a second gate electrode, a second source electrode, and a second drain electrode, the second source electrode and the second drain electrode are arranged on a side of the second active layer away from the substrate, the second gate electrode is located on aside of the second active layer close to the second source, and the display panel further includes a third barrier layer, and the third barrier layer disposed between the second gate electrode and the second active layer.

The present disclosure also provides a display device, which includes the display panel described above.

The display panel and the display device provided by the present disclosure have a hybrid driving circuit of polycrystalline oxide semiconductor and amorphous oxide semiconductor, use an amorphous oxide semiconductor transistor with low leakage current and high uniformity as a switching transistor, and use a polycrystalline oxide semiconductor of high mobility and low off-leakage current as a drive transistor, thereby reducing the leakage current and improving display quality. The first transistor and the second transistor are arranged in different layers, and the first active layer and the second active layer are separated by the first interlayer insulating layer, thus reducing the probability of both the first active layer and the second active layer being invaded by water or oxygen at the same time, and improving the stability of the driving circuit. On the other hand, the polycrystalline oxide semiconductor can replace LTPS in large-scale display panels and display devices to overcome the technical bottleneck that LTPO technology can only be used in small-scale and medium-scale display panels and display devices since the polycrystalline oxide semiconductor has a more uniform grain size than LTPS, which make it possible to be applied in panels and display devices of G8.5 and above generation lines in the future.

BRIEF DESCRIPTION OF DRAWINGS

In order to more clearly illustrate the technical solution of embodiments of this disclosure, a brief description of drawings that are necessary for the illustration of the embodiments of this disclosure will be given as follows. Obviously, the drawings described below show only some embodiments of this disclosure, and a person having ordinary skill in the art may also obtain other drawings based on the drawings described without making any creative effort.

FIG. 3(a) to FIG. 3(j) are schematic diagrams of steps of a method for manufacturing a display panel according to an embodiment of the present disclosure.

FIG. 4 is a partial top view of a first transistor of a display panel according to an embodiment of the present disclosure.

FIG. 5(a) to FIG. 5(f) are schematic diagrams of specific steps of FIG. 3(b) to FIG. 3(c) and cross-sectional views along a line A-A of FIG. 4.

DETAILED DESCRIPTION OF PREFERRED EMBODIMENTS

The following will clearly and completely describe the technical solution in the disclosure with reference to the accompanying drawings in the embodiments of the disclosure. Apparently, the described embodiments are only a part of the embodiments of the present disclosure, not all of them. Based on the embodiments in the disclosure, all other embodiments obtained by those skilled in the art without doing creative work belong to the scope of protection in the disclosure.

In this disclosure, unless otherwise clearly specified and limited, a first feature being "on" or "below" a second feature may include the first and second features directly, or may include that the first and second features are not directly connected but through another characteristic contact between them. Moreover, the first feature "on", "up" or "above" the second feature include that the first feature is directly above and obliquely above the second feature, or only indicate that the horizontal height of the first feature is greater than the second feature. The first feature "under", "below" or "beneath" of the second feature include the first feature directly below and obliquely below the second feature, or only indicate that the horizontal height of the first feature is less than the second feature. In addition, the terms "first" and "second" are used for descriptive purposes only, and cannot be interpreted as indicating or implying relative importance or implicitly specifying the quantity of indicated technical features. Thus, features defined as "first" and "second" may explicitly or implicitly include one or more features.

An embodiment of the present disclosure provides a display panel. The display panel may be an organic light-emitting diode (OLED) display panel, specifically, may be an active matrix organic light-emitting diode (AMOLED) display panel, or a passive matrix organic light-emitting diode (PMOLED) display panel.

The display panel includes a substrate, a first transistor disposed on the substrate, a first interlayer insulating layer covering a side of the first transistor away from the substrate, and a second transistor disposed on a side of the first interlayer insulating layer away from the first transistor. The first transistor includes a first active layer, and the second transistor includes a second active layer.

Figure 1:
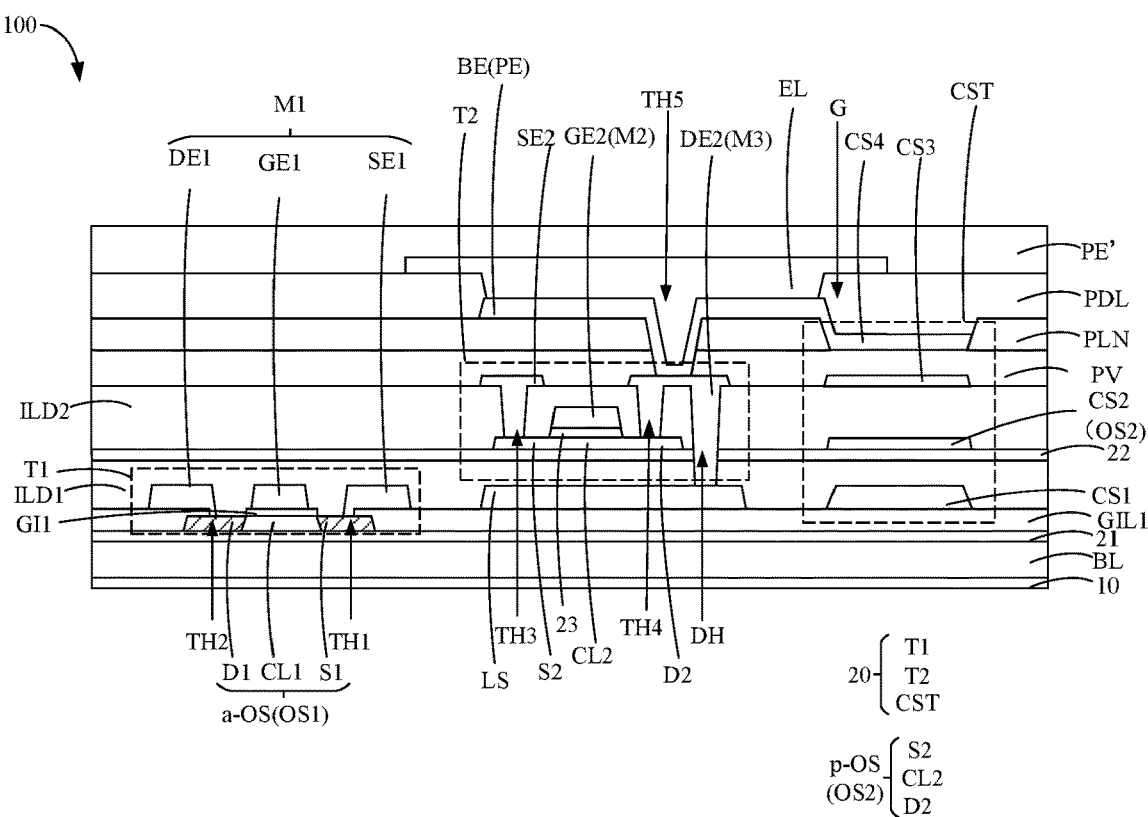
FIG. 1 is a schematic structural diagram of a display panel according to an embodiment of the present disclosure.

Hereinafter, referring to FIG. 1, the display panel according to an embodiment of the present disclosure will be described in detail from bottom to top.

The display panel 100 includes a substrate 10, a pixel driving circuit 20 disposed on the substrate 10, and a light emitting layer 30 disposed on and connected to the pixel driving circuit 20. The pixel driving circuit 20 may be a pixel driving circuit commonly used in the technical field such as 2T1C circuit, 3T1C circuit, 5T1C circuit or 7T1C circuit. In the embodiment, the pixel driving circuit 20 is a 2T1C circuit. The pixel driving circuit 20 of 2T1C includes a first transistor T1, a second transistor T2, and a storage capacitor CST connected to each other. The first transistor T1 is a switching transistor, and the second transistor T2 is a driving transistor.

Specifically, the display panel 100 includes the substrate 10, a buffer layer BL, a first barrier layer 21, a first oxide semiconductor layer OS1, a first gate insulating layer GIL1, a first metal layer M1, a first interlayer insulating layer ILD1, a second barrier layer 22, a second oxide semiconductor layer OS2, a third barrier layer 23, a second metal layer M2, a second interlayer insulating layer ILD2, a third metal layer M3, a passivation layer PV, a planarization layer PLN, a bottom electrode layer PE, a pixel definition layer PDL, a light emitting function layer EL, and a top electrode layer PE' disposed on the substrate 10.

The substrate 10 is used to support other display elements disposed on the substrate 10. The substrate 10 may be glass, plastic or flexible substrate and the like. Specifically, the flexible substrate 10 may be composed of a single flexible organic layer, or may be composed of two or more flexible organic layers. In one embodiment, the substrate 10 includes a first flexible organic layer, a barrier layer, and a second flexible organic layer stacked in sequence. Materials of the first flexible organic layer and the second flexible organic layer are selected from polyimide (PI), polyethylene naphthalate (PEN), polyethylene terephthalate (PET), polyarylester (PAR), polycarbonate (PC), polyetherimide (PEI), and polyethersulfone (PES). A material of the barrier layer is selected from inorganic materials such as silicon dioxide and silicon nitride. In the embodiment, the substrate 10 is a glass substrate.

The buffer layer BL is used to enhance the bonding force between the film layers on the substrate 10 and the substrate 10. A material of the buffer layer BL is one of silicon oxide, nitrogen oxide, and silicon oxynitride, or a stack thereof. In the embodiment, the buffer layer BL covers the entire surface of the substrate 10.

The first barrier layer 21 is disposed between the buffer layer BL and the first oxide semiconductor layer OS1. When hydrogen, water vapor, or oxygen enters an oxide semiconductor layer from a film layer adjacent to the oxide semiconductor layer, TFT characteristics may deteriorate. The first barrier layer 21 is used to block external hydrogen, water vapor or oxygen, and prevent the first oxide semiconductor layer OS1 from being affected by hydrogen, water vapor or oxygen. A material of the first barrier layer 21 is selected from one of aluminum oxide, hafnium oxide, and yttrium oxide, or a combination thereof.

The first oxide semiconductor layer OS1 includes a first active layer a-OS. A material of the first active layer a-OS is an amorphous oxide semiconductor. The first active layer a-OS includes a first channel CL1 and a first source part S1 and a first drain part D1 respectively located on both sides of the first channel CL1. The first channel CL1 is connected to the first source part S1 and the first drain part D1. As shown in FIG. 1, "located on both sides of the first channel CL1" here refers to two sides in a direction parallel to a surface of the substrate 10. The first channel CL1 is an amorphous oxide semiconductor, and the first source part S1 and the first drain part D1 are conducted amorphous oxide semiconductors. Specifically, the amorphous oxide semiconductor may be selected from one or more of indium gallium zinc oxide (IGZO), indium gallium zinc tin oxide (IGZTO), indium zinc oxide (IZO), gallium indium oxide (IGO), indium gallium tin oxide (IGTO), and indium Zinc Tin Oxide (IZTO), but not limited thereto. In the embodiment, the first barrier layer 21 is provided as a complete layer covering the buffer layer BL. Optionally, the first barrier layer 21 may be only disposed under the first active layer a-OS.

The first gate insulating layer GIL1 covers the first oxide semiconductor layer OS1 and the first barrier layer 21. A first through-hole TH1 and a second through-hole TH2 are defined in the first gate insulating layer GIL1. The first source part S1 is exposed from the first through-hole TH1, and the first drain part D1 is exposed from the second through-hole TH2. The first gate insulating layer GIL1 includes a first gate insulating part GI1 located above the first channel CL1 of the first active layer a-OS. The first gate insulating part GI1 is island-shaped, that is, it is disposed independently from other parts of the first gate insulating layer GIL1.

The first metal layer M1 includes a first gate electrode GE1, a first source electrode SE1, a first drain electrode DE1, a light shielding layer LS and a first capacitor plate CS1 which are insulated from each other. The first gate electrode GE1, the first source electrode SE1 and the first drain electrode DE1 serve as the gate electrode, the source electrode, and the drain electrode of the first transistor T1, respectively. The first gate electrode GE1 is disposed on the island-shaped first gate insulating part GI1. The first source electrode SE1 extends into the first through-hole TH1 to connect the first source part S1, and the first drain electrode DE1 extends into the second through-hole TH2 to connect the first drain part D1. The light-shielding layer LS shields the second transistor T2 from light to prevent the second transistor T2 from being affected by light and improve its stability. The first capacitor plate CS1 serves as one capacitor plate of the storage capacitor CST. The first gate electrode GE1, the first source electrode SE1, the first drain electrode DE1, the light-shielding layer LS, and the first capacitor plate CS1 are arranged in a same layer and made of a same material, which can be made with a single photomask, thereby reducing the number of photomasks used in the manufacturing of the display panel 100 of the present disclosure, thus reducing cost. It should be noted that "arranged in a same layer" in the disclosure does not mean that the elements are located on a same horizontal plane, but that the elements "arranged in a same layer" belong to a same film layer from the perspective of the film layer structure. A material of the first metal layer M1 can be selected from one of copper (Cu), tantalum (Ta), tungsten (W), molybdenum (Mo), aluminum (Al), titanium (Ti), nickel (Ni), and their alloys, or a stack thereof. The first metal layer M1 may have a structure of single layer or multilayer. When the first metal layer M1 has a structure of multilayer, it may be a stack of two or more of copper (Cu), tantalum (Ta), tungsten (W), molybdenum (Mo), aluminum (Al), titanium (Ti), nickel (Ni), and an alloy thereof. In a specific embodiment, the first metal layer M1 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms.

The first interlayer insulating layer ILD1 covers the first metal layer M1 and the first gate insulating layer GIL1, and extends into the first through-hole TH1 and second through-hole TH2. A material of the first interlayer insulating layer ILD1 is one of silicon oxide, nitrogen oxide, and silicon oxynitride, or a stack thereof.

The second barrier layer 22 covers the first interlayer insulating layer ILD1. That is to say, the second barrier layer 22 is disposed between the first transistor T1 and the second transistor T2 to block hydrogen, water vapor or oxygen, and prevent the first transistor T1 and the second transistor T2 from being affected by hydrogen, water vapor or oxygen. A material of the second barrier layer 22 is selected from one of aluminum oxide, hafnium oxide, and yttrium oxide, or a combination thereof. In the embodiment, the second barrier layer 22 is provided to cover the entire surface of the first interlayer insulating layer ILD1. Optionally, the second barrier layer 22 may also be disposed only above the first oxide semiconductor layer OS1 of the first transistor T1 and below the second oxide semiconductor layer OS2 of the second transistor T2.

The second oxide semiconductor layer OS2 includes a second active layer p-OS. A material of the second active layer p-OS is a polycrystalline oxide semiconductor. The second active layer p-OS includes a second channel CL2 and a second source part S2 and a second drain part D2 respectively located on both sides of the second channel CL2. The second channel CL2 is connected to the second source part S2 and the second drain part D2. As shown in FIG. 1, "located on both sides of the second channel CL2" here refers to two sides in a direction parallel to the surface of the substrate 10. The second channel CL2 is a polycrystalline oxide semiconductor, and the second source part S2 and the second drain part D2 are conducted polycrystalline oxide semiconductors. Specifically, the polycrystalline oxide semiconductor may be selected from one or more of indium gallium zinc oxide (IGZO), indium gallium zinc tin oxide (IGZTO), indium zinc oxide (IZO), gallium indium oxide (IGO), indium gallium tin oxide (IGTO), and indium Zinc Tin Oxide (IZTO), but not limited thereto. In the embodiment, the second barrier layer 22 is provided as a complete layer covering the first interlayer insulating layer ILD1.

Optionally, the second barrier layer 22 may be disposed only under the second active layer p-OS.

The second oxide semiconductor layer OS2 further includes a second capacitor plate CS2 spaced and insulated from the second active layer p-OS. The second capacitor plate CS2 serves as one capacitor plate of the storage capacitor CST and is disposed oppositely to the first capacitor plate CS1 in a thickness direction of the display panel 100. The second capacitor plate CS2 is a conducted polycrystalline oxide semiconductor, which can be conducted during the process of conducting the second source part S2 and the second drain part S2.

The third barrier layer 23 is disposed on the second active layer p-OS for blocking hydrogen, water vapor or oxygen, and preventing the second active layer p-OS from being affected by hydrogen, water vapor or oxygen. A material of the third barrier layer 23 is selected from one of aluminum oxide, hafnium oxide, and yttrium oxide, or a combination thereof. In the embodiment, the third barrier layer 23 is also used as the gate insulating part of the second transistor T2. Therefore, the third barrier layer 23 is island-shaped. Optionally, the display panel 100 may further include a second gate insulating part (not shown), and the third barrier layer 23 is disposed on the second gate insulating part. Alternatively, the third barrier layer 23 is provided to cover the entire surface of the second active layer p-OS, and even to cover the entire surface of the second barrier layer 22.

The second metal layer M2 includes a second gate electrode GE2 disposed on the island-shaped third barrier layer 23 (i.e., the second gate insulating part). The second gate electrode GE2 serves as the gate electrode of the second transistor T2. A material of the second metal layer M2 can be selected from one of copper (Cu), tantalum (Ta), tungsten (W), molybdenum (Mo), aluminum (Al), titanium (Ti), nickel (Ni) and their alloys, or a stack thereof. The second metal layer M2 may have a structure of single layer or multilayer. When the second metal layer M2 has a structure of multilayer, it may be a stack of two or more of copper (Cu), tantalum (Ta), tungsten (W), molybdenum (Mo), aluminum (Al), titanium (Ti), nickel (Ni), and an alloy thereof. In a specific embodiment, the second metal layer M2 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms.

The second interlayer insulating layer ILD2 covers the second barrier layer 22, the second oxide semiconductor layer OS2, the third barrier layer 23, and the second metal layer M2. In the embodiment, the second interlayer insulating layer ILD2 covers the entire surface of the second barrier layer 22, the entire surface of the second oxide semiconductor layer OS2, the entire surface of the third barrier layer 23, and the entire surface of the second metal layer M2. A thickness of the second barrier layer 22 ranges from 100 angstroms to 500 angstroms, and a thickness of the first interlayer insulating layer ILD1 ranges from 2000 angstroms to 10000 angstroms. The second interlayer insulating layer ILD2 is one of silicon oxide, nitrogen oxide, and silicon oxynitride, or a stack thereof.

The third metal layer M3 includes a second source electrode SE2, a second drain electrode DE2, and a third capacitor plate CS3 insulated from each other. The second source electrode SE2 and the second drain electrode DE2 serve as the source electrode and the drain electrode of the second transistor T2, respectively. The second source electrode SE2 extends into a third through-hole TH3 defined in the second interlayer insulating layer ILD2 to connect the second source part S2, and the second drain electrode DE2 extends into a through-hole TH4 defined in the second interlayer insulating layer ILD2 to connect the second drain part D2. In addition, the second drain electrode DE2 is also connected to the light shielding layer LS through a deep hole DH going through the second interlayer insulating layer ILD2, the second barrier layer 22, and the first interlayer insulating layer ILD1.

The third capacitor plate CS3 serves as one capacitor plate of the storage capacitor CST and is disposed oppositely to the second capacitor plate CS2 in the thickness direction of the display panel 100. The second source electrode SE2, the second drain electrode DE2, and the third capacitor plate CS3 are arranged in a same layer and made of a same material, and can be made with one photomask, thereby reducing the number of photomasks for manufacturing the display panel 100 of the present disclosure, thus reducing cost. The material of the third metal layer M3 can be selected from copper (Cu), tantalum (Ta), tungsten (W), molybdenum (Mo), aluminum (Al), titanium (Ti), nickel (Ni) and their alloys One or stack. The third metal layer M2 may have a structure of single layer or multilayer. When the third metal layer M3 has a structure of multilayer, it may be attack of two or more of copper (Cu), tantalum (Ta), tungsten (W), molybdenum (Mo), aluminum (Al), titanium (Ti), nickel (Ni), and an alloy thereof. In a specific embodiment, the third metal layer M3 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms.

Optionally, in another embodiment of the present disclosure, the storage capacitor of the display panel 100 is disposed on a peripheral side of the second transistor T2. The second capacitor plate CS2 and the third capacitor plate CS3 are arranged oppositely to each other, serving as two capacitor plates of the storage capacitor.

The passivation layer PV covers the second interlayer insulating layer ILD2 and the third metal layer M3. A material of the passivation layer PV is one of silicon oxide, nitrogen oxide, and silicon oxynitride, or a stack thereof.

A planarization layer PLN covers the passivation layer PV. A material of the planarization layer PLN may be an organic material such as acrylic resin, epoxy resin, and perfluoroalkoxy resin (PFA).

The bottom electrode layer PE is disposed on the planarization layer PLN, and includes an anode BE of the organic light emitting device and the fourth electrode capacitor plate CS4. The anode BE is connected to the fourth capacitor plate CS4. A fifth through-hole TH5 is defined in the passivation layer PV and the planarization layer PLN (collectively referred to as: electrode insulating layer), and the anode BE of the organic light emitting device extends into the fifth through-hole TH5 to connect the second drain electrode DE2. A groove G is also defined in the planarization layer PLN, and the fourth capacitor plate CS4 is located in the groove G. Optionally, the display panel 100 may not include the planarization layer PLN, and the passivation layer PV serves as electrode insulating layer at this time. The fourth capacitor plate CS4 serves as one capacitor plate of the storage capacitor CST and is disposed oppositely to the third capacitor plate CS3 in the thickness direction of the display panel 100. A material of the bottom electrode layer PE may be a metal or a metal oxide, for example, may be selected from metals such as aluminum, gold, and silver, or metal oxides such as indium tin oxide, or a stack of metal and metal oxide.

The pixel definition layer PDL is disposed on the bottom electrode layer PE. An opening is defined in the pixel definition layer PDL, and the anode BE is exposed from the opening of the pixel definition layer PDL.

The light emitting functional layer EL is disposed in the opening of the pixel definition layer PDL and connected to the anode BE.

The top electrode layer PE' covers the entire surface of the pixel definition layer PDL and the entire surface of the light-emitting functional layer EL, and serves as the cathode of the light-emitting layer 30. The anode BE, the pixel definition layer PDL, the light emitting functional layer EL, and the top electrode layer PE' together constitute the light emitting layer 30 of the display panel 100.

At present, various manufacturers are developing polycrystalline oxide semiconductor materials. Although different manufacturers use different material systems and element ratios, the polycrystalline oxide semiconductor materials currently on the market can achieve high mobility similar to LTPS and lower cut-off leakage current than LTPS. For example, polycrystalline oxide semiconductor materials developed by Idemitsu Kosan Co., ltd. have high mobility and low off-leakage current.

The display panel 100 provided by the present disclosure have a hybrid driving circuit of polycrystalline oxide semiconductor and amorphous oxide semiconductor, use an amorphous oxide semiconductor transistor with low leakage current and high uniformity as a switching transistor, and use a polycrystalline oxide semiconductor of high mobility and low off-leakage current as a drive transistor, thereby reducing the leakage current and improving display quality. The first transistor and the second transistor are arranged in different layers, and the first active layer and the second active layer are separated by the first interlayer insulating layer, thus reducing the probability of both the first active layer and the second active layer being invaded by water or oxygen at the same time, and improving the stability of the driving circuit. The first transistor and the second transistor are arranged in different layers, therefore different materials can be selected for the first transistor and the second transistor, high process freedom is allowed, and the two active layers will not affect each other when conducting.

On the other hand, the current manufacturing process of polycrystalline oxide materials is generally as follows: preparing an amorphous oxide semiconductor film and then performing annealing treatment to convert the amorphous oxide semiconductor into a polycrystalline state. The annealing temperature is lower than the annealing temperature of the crystal silicon process, and no Excimer laser annealing process is needed. Therefore, the polycrystalline oxide semiconductor can replace LTPS in large-scale display panels to overcome the technical bottleneck that LTPO technology can only be used in small-scale and medium-scale display panels since the polycrystalline oxide semiconductor has a more uniform grain size than LTPS, which makes it possible to be applied in panels of G8.5 and above generation lines in the future. Specifically, a large-scale display panel refers to a display panel larger than 45 inches.

In some embodiments, the first gate electrode GE1, the first source electrode SE1, the first drain electrode DE1, the light shielding layer LS, and the first capacitor plate CS1 are arranged in the same layer and made of the same material, and can be made with a single photomask, thereby reducing the number of photomasks used in the manufacturing of the display panel 100 of the present disclosure, thus reducing cost.

The storage capacitor CST of the display panel 100 in some embodiments of the present disclosure includes a conducted polycrystalline oxide semiconductor as the second capacitor plate CS2, and the second capacitor plate CS2 and the second active layer p-OS are arranged in the same layer and can be manufactured in a single mask process, thereby saving materials and processes.

The first capacitor plate CS1 and the second capacitor plate CS2 are arranged oppositely to each other to form the first capacitor, the second capacitor plate CS2 and the third capacitor plate CS3 are arranged oppositely to each other to form the second capacitor, and the first capacitor and the second capacitor are connected in parallel to increase capacitance value of the storage capacitor CST.

In addition, the third capacitor plate CS3 and the fourth capacitor plate CS4 are arranged oppositely to each other to form a third capacitor, and the first capacitor, the second capacitor and the third capacitor are connected in parallel to form a storage capacitor CST, further increasing the capacitance value of the storage capacitor.

In some embodiments, the first capacitor plate CS1 is arranged in the same layer as the first gate electrode GE1, the second capacitor plate CS2 is arranged in the same layer as the polycrystalline oxide semiconductor layer p-OS, the third capacitor plate CS3 is arranged in the same layer as the second drain electrode DE2, and the fourth capacitor plate CS4 is arranged in the same layer as the anode BE and also connected to the anode BE, and a storage capacitor can be formed by using an already existing photomask.

At the same time, with the pursuit of higher resolution and refresh rate for display devices, the design of pixel capacitors needs to meet the driving requirements of high refresh rates under the condition of shrinking capacitor area. The display panel 100 of the embodiment of the present disclosure can also reduce the area of capacitor region and increase aperture ratio while ensuring capacitance value. It should be noted that the four capacitor plates can realize the parallel connection of the above three plate capacitors through wirings. The schematic diagram in FIG. 1 is only used to show the film layer structure of the display panel 100, not showing the connection by wirings.

In some embodiments, a thickness of the planarization layer PLN is generally several microns. It is known that the capacitance value of a plate capacitor is inversely proportional to the distance between the capacitor plates. To increase the capacitance value of the storage capacitor CST, it is necessary to dig holes in the planarization layer PLN in the capacitor region to allow the four capacitor plates 10 to directly contact the passivation layer PV, thereby reducing the distance between capacitor plates, and increasing the capacitance value of the storage capacitor CST.

In some embodiments, the first barrier layer 21 is provided between the first interlayer insulating layer ILD1 and the second transistor T2 to prevent the second transistor T2 from being intruded by water vapor, oxygen or hydrogen.

In some embodiments, the second barrier layer 22 is disposed between the buffer layer BL and the first active layer OS-1 to prevent the first transistor T1 from being intruded by water vapor, oxygen or hydrogen.

In some embodiments, since the thickness of the second barrier layer 22 is relatively thin (less than 500 angstroms), foreign matter (particles) may be introduced during the manufacturing process to cause an interlayer short circuit and affect process yield. But the thickness of the second interlayer insulating layer ILD2 is relatively high, which provides a flattened surface above the second barrier layer 22 to prevent short circuits caused by foreign matters and ensure process yield.

In some embodiments, a third barrier layer 23 is disposed between the second gate electrode GE2 and the second active layer OS-2 to prevent the second transistor T2 from being intruded by water vapor, oxygen or hydrogen.

Figure 2:
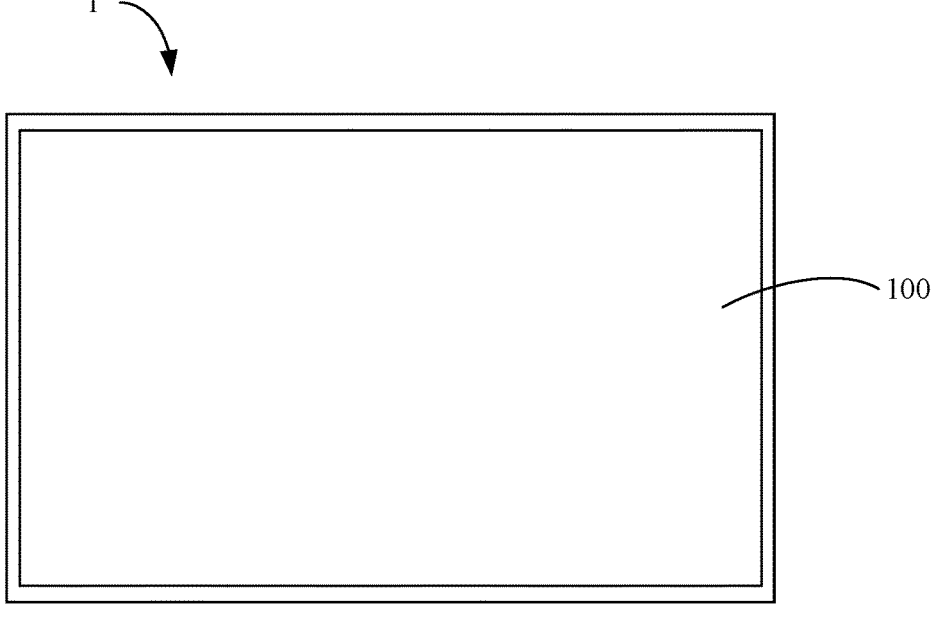
FIG. 2 is a schematic structural diagram of a display device according to an embodiment of the present disclosure.

Referring to FIG. 2, an embodiment of the present disclosure also provides a display device 1. The display device 1 can be a mobile phone, a tablet computer, an e-reader, an electronic display screen, a notebook computer, a mobile phone, an augmented reality (augmented reality, AR) or virtual reality (virtual reality, VR) device, a media player, a wearable device, digital cameras, vehicle navigators, etc. The display device 1 includes the display panel 100 of the present disclosure.

Please refer to FIGS. 3(a) to 3(j), an embodiment of the present disclosure also provides a method for manufacturing a display panel, which includes the following steps:

101: Referring to FIG. 3(a), providing a substrate 10, and sequentially forming a buffer layer BL and a first barrier layer 21 on the substrate 10. The buffer layer BL is one or a combination of silicon nitride and silicon oxide. A thickness of the buffer layer BL ranges from 2000 angstroms to 10000 angstroms, and a material of the first barrier layer 21 is aluminum oxide with a thickness of 100 angstroms to 500 angstroms.

102: Forming a first semiconductor material layer 30 on the first barrier layer 21. A material of the first semiconductor material layer 30 is an amorphous oxide semiconductor with a thickness ranging from 100 angstroms to 1000 angstroms.

103: Referring to FIG. 3(b), forming a first gate insulating layer GIL1 on the first semiconductor material layer 30. A material of the first gate insulating layer GIL1 is silicon oxide with a thickness ranging from 1000 angstroms to 3000 angstroms. The first gate insulating layer GIL1 is patterned by yellow light process, the first gate insulating part GI1 is formed on the first semiconductor material layer 30, and a first through whole TH1 and a second through whole TH1 are defined in the first gate insulating layer GIL1. The amorphous oxide semiconductor exposed from the first through-hole TH1 and the second through-hole TH2 is treated with helium plasma (He Plasma) for conducting.

104: Referring to FIG. 3(c), forming a first metal layer M1 on the first gate insulating layer GIL1 including a first gate electrode GE1, a first source electrode SE1, a first drain electrode DE1, a light-shielding layer LS, and a first capacitor plate CS1. The first gate electrode GE1 is disposed on the first gate insulating part GI1. The first source electrode SE1 extends into the first through-hole TH1 to connect the first source part S1, and the first drain electrode DE1 extends into the second through-hole TH2 to connect the first drain part D1. Furthermore, after a gate self-aligned structure is formed, a second conducting treatment is performed on the first semiconductor material layer 30 in the first through-hole TH1 and the second through-hole TH2. The first metal layer M1 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms.

105: Referring to FIG. 3(d), forming a first interlayer insulating layer ILD1 and a second barrier layer 22 on the first metal layer M1. A material of the first interlayer insulating layer ILD1 is silicon oxide with a thickness ranging from 2000 angstroms to 10000 angstroms, and a material of the second barrier layer 22 is aluminum oxide with a thickness ranging from 100 angstroms to 500 angstroms.

106: Forming a second oxide semiconductor layer OS2 on the second barrier layer 22. The second oxide semiconductor layer OS2 includes a second active layer p-OS of the second transistor T2 and a second capacitor plate CS2 spaced and insulated from the second active layer p-OS. A thickness of the second oxide semiconductor layer OS2 ranges from 100 angstroms to 1000 angstroms.

107: Please refer to FIG. 3(e), forming the third barrier layer 23 and the second metal layer M2 on the second oxide semiconductor layer OS2, and patterning the third barrier layer 23 and the second metal layer M2 to include the top gate self-aligned structure of the second gate electrode GE2. A material of the third barrier layer 23 is aluminum oxide with a thickness ranging from 500 angstroms to 1000 angstroms. In a specific embodiment, the second metal layer M2 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms. The second metal layer M2 also includes a third capacitor plate CS3.

108: Referring to FIG. 3(f), forming a second interlayer insulating layer ILD2 on the third barrier layer 23 and the second metal layer M2. A material of the second interlayer insulating layer ILD2 is silicon oxide with a thickness ranging from 2000 angstroms to 10000 angstroms, a third through-hole TH3, a fourth through-hole TH4, and a deep hole DH are defined by patterning with etching. The third through-hole TH3 and the fourth through-hole TH4 go through the second interlayer insulating layer ILD2, and the deep hole DH goes through the second interlayer insulating layer ILD2, the second barrier layer 22, and the first interlayer insulating layer ILD1.

109: Please refer to FIG. 3(g), forming the third metal layer M3 on the second interlayer insulating layer ILD2. The third metal layer M3 includes a second source electrode SE2, a second drain electrode DE2 and a third capacitor plate CS3 insulated from each other. The second source electrode SE2 and the second drain electrode DE2 respectively serve as the source electrode and the drain electrode of the second transistor T2. The second source electrode SE2 extends into the third through-hole TH3 defined in the second interlayer insulating layer ILD2 to connect the second source part S2, and the second drain electrode DE2 extends into the through-hole TH4 defined in the second interlayer insulating layer ILD2 to connect the second drain part D2. In addition, the second drain electrode DE2 is also connected to the light shielding layer LS through the deep hole DH going through the second interlayer insulating layer ILD2, the second barrier layer 22, and the first interlayer insulating layer ILD1.

In a specific embodiment, the third metal layer M3 is composed of three layers: a lower layer containing one of Mo, Ti, and Ni, or an alloy thereof, a middle layer of Cu or Cu alloy, and an upper layer containing one of Mo, Ti, and Ni, or an alloy thereof. A thickness of the lower layer ranges from 50 angstroms to 500 angstroms, a thickness of the middle layer ranges from 2000 angstroms to 10000 angstroms, and a thickness of the upper layer ranges from 50 angstroms to 500 angstroms.

110: Referring to FIG. 3(h), forming a passivation layer PV and a planarization layer PLN on the third metal layer M3. A material of the passivation layer PV is silicon oxide, and a material of the planarization layer PLN is an organic material. A half-tone mask is used to define a fifth through-hole TH5 going through the passivation layer PV and the planarization layer PLN and a groove G going through the planarization layer PLN. A thickness of the passivation layer PV ranges from 1000 angstroms to 5000 angstroms.

111: Please refer to FIG. 3(i), forming a bottom electrode layer PE on the planar layer PLN and patterned. The bottom electrode layer PE includes an anode BE of an organic light emitting device and a fourth capacitor plate CS4. A material of the anode BE is a stack of ITO/Ag/ITO.

112: Referring to FIG. 3(j), sequentially forming a pixel definition layer PDL, a light-emitting function layer EL, and a top electrode layer PE' on the bottom electrode layer PE.

Further, please refer to FIGS. 4 and 5(a) to 5(e), and the specific steps in FIGS. 3(b) to 3(c) are as follows:

201: Referring to FIG. 5(a), forming a first photoresist PR1 layer on the first gate insulating layer GIL1, and defining openings OP in the first photoresist PR1 layer at both ends of the first active layer a-OS.

It should be noted that, in FIG. 5(a) to FIG. 5(e), only the formation process of the drain electrode side of the TFT is shown, and the formation process of the source electrode side is the same, which is omitted here.

202: Please refer to FIG. 5(b), the first gate insulating layer GIL1 is etched to expose both ends of the first active layer a-OS under the protection of the first photoresist PR1 layer.

203: Referring to FIG. 5(c), performing a first conducting treatment on both ends of the first active layer a-OS exposed, and removing the first photoresist PR1 layer. As shown in FIG. 5(c), the first conductor part C1 is formed in the first active layer a-OS.

204: Please refer to FIG. 5(d), forming a metal layer on the first gate insulating layer GIL1, and forming a second photoresist PR2 on the metal layer through exposure and development, etching the metal layer under the protection of the second photoresist PR2 to form a first gate electrode GE1, a first source electrode SE1 and a first drain electrode DE1. For subsequent connection, the first source electrode SE1 and the first drain electrode DE1 extend into the first through-hole TH1 and the second through-hole TH2, respectively. While etching the metal layer, a part of the first conductor part C1 which is not covered by the second photoresist PR2 is removed. Also, the first source electrode SE1 and the first drain electrode DE1 respectively cover the unetched first conductor part C1 left in the first through-hole TH1 and the second through-hole TH2.

205: Please refer to FIG. 5(e), etching and removing the first gate insulating layer GIL1, and performing the second conducting treatment on the first active layer a-OS, under the protection of the second photoresist PR2. The first active layer a-OS which is not covered by the first gate electrode GE1 is conduced to form a first source region S1 and a first drain region D1.

206: Please refer to FIG. 5(f), peeling off the second photoresist PR2.

The display panel provided by the present disclosure have a hybrid driving circuit of polycrystalline oxide semiconductor and amorphous oxide semiconductor, use an amorphous oxide semiconductor transistor with low leakage current and high uniformity as a switching transistor, and use a polycrystalline oxide semiconductor of high mobility and low off-leakage current as a drive transistor, thereby reducing the leakage current and improving display quality. The first transistor and the second transistor are arranged in different layers, and the first active layer and the second active layer are separated by the first interlayer insulating layer, thus reducing the probability of both the first active layer and the second active layer being invaded by water or oxygen at the same time, and improving the stability of the driving circuit.

The above provides a detailed introduction to the embodiments of the present disclosure. In this paper, specific examples are used to illustrate the principles and embodiments of the present disclosure. The descriptions of the above embodiments are only used to help understand the present disclosure. At the same time, for those skilled in the art, based on the idea of this disclosure, there will be changes in the specific implementation and disclosure scope. In summary, the content of this specification should not be construed as limiting the disclosure.

What is claimed is:

1. A display panel, comprising:
a substrate;
a first transistor arranged on the substrate, wherein the first transistor comprises a first active layer, and a material of the first active layer is an amorphous oxide semiconductor;
a first interlayer insulating layer covering a side of the first transistor away from the substrate; and
a second transistor disposed on a side of the first interlayer insulating layer away from the first transistor, wherein the second transistor comprises a second active layer, and a material of the second active layer is a polycrystalline oxide semiconductor;
wherein the first transistor further comprises a first gate insulating layer covering the first active layer, a first gate electrode, a first source electrode, and a first drain electrode of the first transistor are located on a side of the interlayer insulating layer away from the second transistor, and located on a side of the first gate insulating layer away from the substrate; and
wherein the display panel further comprises a first barrier layer disposed between the first interlayer insulating layer and the second transistor.

2. The display panel of claim 1, wherein the second transistor comprises a second gate insulating layer and a second interlayer insulating layer sequentially covering the second active layer, a second source electrode and a second drain electrode of the second transistor are disposed on a side of the interlayer insulating layer away from the first transistor and located on a side of the second interlayer insulating layer away from the substrate, and a second gate electrode is located on a side of the second active layer close to the second source electrode.

3. The display panel of claim 2, further comprising a storage capacitor, the storage capacitor is disposed on a peripheral side of the second transistor, and the storage capacitor comprises a first capacitor plate and a second capacitor plate, the first capacitor plate and the second capacitor plate form a first capacitor, the second capacitor plate and the second active layer are arranged on a same layer, a material of the second capacitor plate is a conducted polycrystalline oxide semiconductor, and the first capacitor plate and the first gate electrode are arranged in a same layer.

4. The display panel of claim 3, wherein the storage capacitor further comprises a third capacitor plate, and the third capacitor plate and the first capacitor plate are respectively located on opposite sides of the second capacitor plate, the third capacitor plate and the second capacitor plate form a second capacitor, the second capacitor is connected in parallel with the first capacitor, and the third capacitor plate and the second drain electrode are arranged in a same layer.

5. The display panel of claim 4, wherein the storage capacitor further comprises a fourth capacitor plate, the fourth capacitor plate is arranged on a side of the third capacitor plate far away from the second capacitor plate, the fourth capacitor plate and the third capacitor plate form a third capacitor, the third capacitor is connected in parallel with the first capacitor and the second capacitor, and the fourth capacitor plate and an anode of the display panel are arranged in a same layer.

6. The display panel of claim 2, further comprising a storage capacitor, the storage capacitor is disposed on a peripheral side of the second transistor, the storage capacitor comprises a first capacitor plate and a second capacitor plate, the first capacitor plate and the second capacitor plate form a first capacitor, the second capacitor plate is arranged on a same layer as the second active layer, a material of the second capacitor plate is a conducted polycrystalline oxide semiconductor, and the first capacitor plate and the second drain electrode are arranged in a same layer.

7. The display panel of claim 5, further comprising a planarization layer located between the second transistor and the anode, wherein the planarization layer is provided with a slot, and the fourth capacitor plate is located in the slot.

8. The display panel of claim 1, further comprising a buffer layer and a second barrier layer, wherein the buffer layer is located between the substrate and the first active layer, and the second barrier layer is disposed between the buffer layer and the first active layer.

9. The display panel of claim 1, wherein the second transistor comprises a second gate electrode, a second source electrode, and a second drain electrode, the second source electrode and the second drain electrode are arranged on a side of the second active layer away from the substrate, the second gate electrode is located on a side of the second active layer close to the second source electrode, the display panel further comprises a third barrier layer, and the third barrier layer is disposed between the second gate electrode and the second active layer.

10. A display device, comprising a display panel, wherein the display panel comprises:
    a substrate;
    a first transistor arranged on the substrate, wherein the first transistor comprises a first active layer, and a material of the first active layer is an amorphous oxide semiconductor;
    a first interlayer insulating layer covering a side of the first transistor away from the substrate; and
    a second transistor disposed on a side of the first interlayer insulating layer away from the first transistor, wherein the second transistor comprises a second active layer, and a material of the second active layer is a polycrystalline oxide semiconductor;
    wherein the first transistor further comprises a first gate insulating layer covering the first active layer, a first gate electrode, a first source electrode, and a first drain electrode of the first transistor are located on a side of the interlayer insulating layer away from the second transistor, and located on a side of the first gate insulating layer away from the substrate; and
    wherein the display panel further comprises a first barrier layer disposed between the first interlayer insulating layer and the second transistor.

11. The display device of claim 10, wherein the second transistor comprises a second gate insulating layer and a second interlayer insulating layer sequentially covering the second active layer, a second source electrode and a second drain electrode of the second transistor are disposed on a side of the interlayer insulating layer away from the first transistor and located on a side of the second interlayer insulating layer away from the substrate, and a second gate electrode is located on a side of the second active layer close to the second source electrode.

12. The display device of claim 11, wherein the display panel further comprises a storage capacitor, the storage capacitor is disposed on a peripheral side of the second transistor, and the storage capacitor comprises a first capacitor plate and a second capacitor plate, the first capacitor plate and the second capacitor plate form a first capacitor, the second capacitor plate and the second active layer are arranged on a same layer, a material of the second capacitor plate is a conducted polycrystalline oxide semiconductor, and the first capacitor plate and the first gate electrode are arranged in a same layer.

13. The display device of claim 12, wherein the storage capacitor further comprises a third capacitor plate, and the third capacitor plate and the first capacitor plate are respectively located on opposite sides of the second capacitor plate, the third capacitor plate and the second capacitor plate form a second capacitor, the second capacitor is connected in parallel with the first capacitor, and the third capacitor plate and the second drain electrode are arranged in a same layer.

14. The display device of claim 13, wherein the storage capacitor further comprises a fourth capacitor plate, the fourth capacitor plate is arranged on a side of the third capacitor plate far away from the second capacitor plate, the fourth capacitor plate and the third capacitor plate form a third capacitor, the third capacitor is connected in parallel with the first capacitor and the second capacitor, and the fourth capacitor plate and an anode of the display panel are arranged in a same layer.

15. The display device of claim 11, wherein the display panel further comprises a storage capacitor, the storage capacitor is disposed on a peripheral side of the second transistor, the storage capacitor comprises a first capacitor plate and a second capacitor plate, the first capacitor plate and the second capacitor plate form a first capacitor, the second capacitor plate is arranged on a same layer as the second active layer, a material of the second capacitor plate is conducted polycrystalline oxide semiconductor, and the first capacitor plate and the second drain electrode are arranged in a same layer.

16. The display device of claim 14, wherein the display panel further comprises a planarization layer located between the second transistor and the anode, wherein the planarization layer is provided with a slot, and the fourth capacitor plate is located in the slot.

17. A display panel, comprising:
    a substrate;
    a first transistor arranged on the substrate, wherein the first transistor comprises a first active layer, and a material of the first active layer is an amorphous oxide semiconductor;

a first interlayer insulating layer covering a side of the first transistor away from the substrate; and a second transistor disposed on a side of the first interlayer insulating layer away from the first transistor, wherein the second transistor comprises a second active layer, and a material of the second active layer is a polycrystalline oxide semiconductor;

wherein the first transistor further comprises a first gate insulating layer covering the first active layer, a first gate electrode, a first source electrode, and a first drain electrode of the first transistor are located on a side of the interlayer insulating layer away from the second transistor, and located on a side of the first gate insulating layer away from the substrate; and wherein the second transistor comprises a second gate electrode, a second source electrode, and a second drain electrode, the second source electrode and the second drain electrode are arranged on a side of the second active layer away from the substrate, the second gate electrode is located on a side of the second active layer close to the second source electrode, the display panel further comprises a third barrier layer, and the third barrier layer is disposed between the second gate electrode and the second active layer.

* * * * *